United States Patent
Lu et al.

(10) Patent No.: US 9,437,650 B2
(45) Date of Patent: *Sep. 6, 2016

(54) IMAGE DEVICE AND METHODS OF FORMING THE SAME

(71) Applicant: Taiwan Semiconductor Manufacturing Company, Ltd., Hsin-Chu (TW)

(72) Inventors: Wen-Chen Lu, Kaohsiung (TW); Ching-Sen Kuo, Taipei (TW); Shih-Chi Fu, Zhudong Township (TW); Ming-Ying Hsieh, Taichung (TW)

(73) Assignee: Taiwam Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,782

(22) Filed: May 26, 2015

(65) Prior Publication Data

US 2015/0255503 A1    Sep. 10, 2015

Related U.S. Application Data

(63) Continuation of application No. 13/487,840, filed on Jun. 4, 2012, now Pat. No. 9,040,341.

(51) Int. Cl.
*H01L 27/14* (2006.01)
*H01L 27/146* (2006.01)

(52) U.S. Cl.
CPC ..... *H01L 27/14687* (2013.01); *H01L 27/1463* (2013.01); *H01L 27/1464* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 7,642,608 | B2 | 1/2010 | Fan et al. | |
|---|---|---|---|---|
| 9,040,341 | B2 * | 5/2015 | Lu | ........................ H01L 27/1463 257/E31.11 |
| 2006/0244015 | A1 | 11/2006 | Rhodes | |

FOREIGN PATENT DOCUMENTS

TW    200847416    12/2008

* cited by examiner

*Primary Examiner* — Seahvosh Nikmanesh
(74) *Attorney, Agent, or Firm* — Slater Matsil, LLP (57) ABSTRACT

A method of forming of an image sensor device includes a patterned hardmask layer is formed over a substrate. The patterned hard mask layer has a plurality of first openings in a periphery region, and a plurality of second openings in a pixel region. A first patterned mask layer is formed over the pixel region to expose the periphery region. A plurality of first trenches is etched into the substrate in the periphery region. Each first trench, each first opening and each second opening are filled with a dielectric material. A second patterned mask layer is formed over the periphery region to expose the pixel region. The dielectric material in each second opening over the pixel region is removed. A plurality of dopants is implanted through each second opening to form various doped isolation features in the pixel region.

20 Claims, 7 Drawing Sheets

IMAGE DEVICE AND METHODS OF FORMING THE SAME

PRIORITY CLAIM

This application claims the benefit to and is a continuation of U.S. patent application Ser. No. 13/487,840, filed on Jun. 4, 2012 and entitled "IMAGE DEVICE AND METHODS OF FORMING THE SAME" which application is incorporated herein by reference.

TECHNICAL FIELD

This disclosure relates to an image sensor device and methods for forming an image sensor device.

BACKGROUND

An image sensor device is one of the building blocks in a digital imaging system such as a digital still or video camera. An image sensor device includes a pixel array (or grid) for detecting light and recording intensity (brightness) of the detected light. The pixel array responds to the light by accumulating a charge—for example, the more light, the higher the charge. The accumulated charge is then used (for example, by other circuitry) to provide a color and brightness signal for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a reduced destructive interference, as compared to front-side illuminated (FSI) image sensor devices.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the image sensor devices.

Due to device scaling, improvements to image sensor device technology are continually being made to further improve image quality of image sensor devices. Although existing image sensor devices and methods of fabricating image sensor devices have been generally adequate for their intended purposes, as device scaling down continues, they have not been entirely satisfactory in all respects.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the present disclosure. Specific examples of components are arrangements, which are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiment in which additional features may be formed interposing the first and second features, such that the first and second features may not be in direct contact. Further still, references to relative terms such as "top", "front", "bottom", and "back" are used to provide a relative relationship between elements and are not intended to imply any absolute direction. Various features may be arbitrarily drawn in different scales for simplicity and clarity.

Figure 1A:
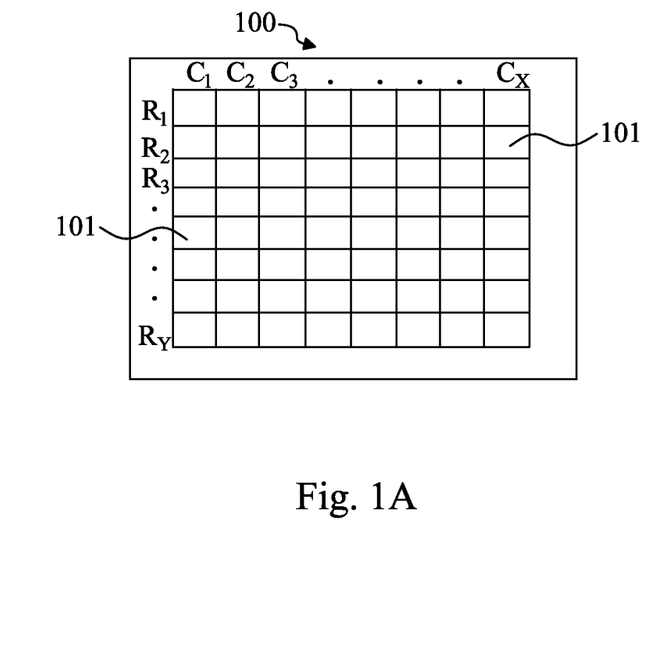
FIG. 1A is a top view of an image sensor device according to various embodiments of this disclosure.

FIG. 1A is a top view of an image sensor device 100 according to various aspects of the present disclosure. In the depicted embodiment, the image sensor device is a backside illuminated (BSI) image sensor device. The image sensor device 100 includes an array of pixel regions 101. Each pixel region 101 is arranged into a column (for example, $C_1$ to $C_x$) and a row (for example, $R_1$ to $R_y$). The term "pixel region" refers to a unit cell containing features (for example, a photodetector and various circuitry), which may include various semiconductor devices for converting electromagnetic radiation to an electrical signal. Photodetectors in the pixel regions 101 may include photodiodes, complimentary metal-oxide-semiconductor (CMOS) image sensors, charged coupling device (CCD) sensors, active sensors, passive sensors, and/or other sensors. In the depicted embodiment, each pixel region 101 may include a photodetector, such as a photogate-type photodetector, for recording an intensity or brightness of light (radiation). Each pixel region 101 may also include various semiconductor devices, such as various transistors including a transfer transistor, a reset transistor, a source-follower transistor, a select transistor, other suitable transistor, or combinations thereof. Additional circuitry, inputs, and/or outputs may be in a periphery region of the image sensor device 100. Those circuitry, inputs, and/or outputs couple to the pixel regions 101 to provide an operation environment for the pixel regions 101 and support external communications with the pixel regions 101. For simplicity, an image sensor device including a single pixel region is described in the present disclosure; however, typically an array of such pixel regions may form the image sensor device 100 illustrated in FIG. 1.

Figure 1B:
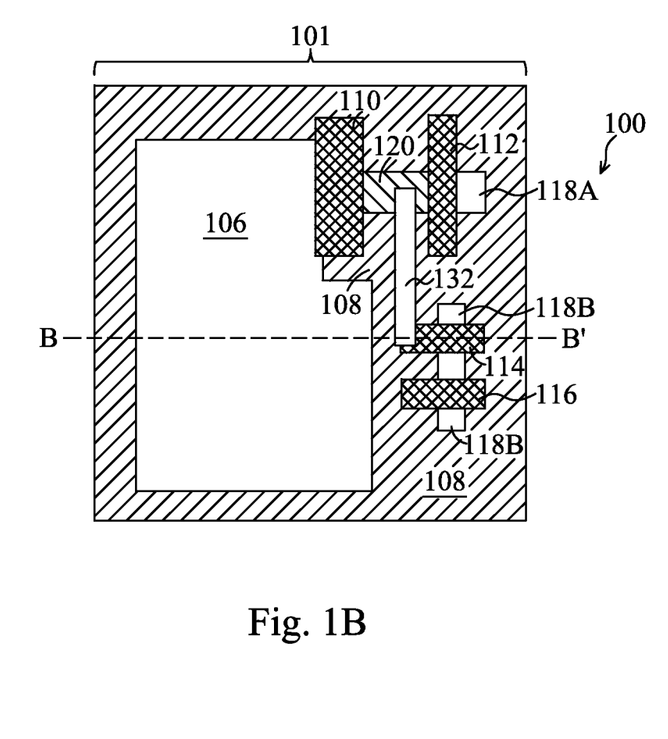
FIG. 1B is an enlarged top view of a pixel region in the image sensor device of FIG. 1A.

FIG. 1B is an enlarged top view of a pixel region 101 in the image sensor device 100 on a substrate (not illustrated in FIG. 1B). The pixel region 101 refers to a unit cell containing at least one photodetector 106 and various circuitry for converting electromagnetic radiation to an electrical signal.

In the depicted embodiment, the photodetector 106 includes a photodiode for recording an intensity or brightness of light (radiation). The pixel region 101 may contain various transistors including a transfer transistor 110, a reset transistor 112, a source-follower transistor 114, a select transistor 116, or other suitable transistors, or combination thereof. The pixel region 101 may also include various doped regions in the substrate, for example doped region 118A, 118B and 120. The doped regions 118A and 118B are configured as source/drain regions of previously mentioned transistors. The doped region 120 is also referred as a floating diffusion region 120. The floating diffusion region 120 is between the transfer transistor 110 and the reset transistor 112, and is one of the source/drain regions for transfer transistor 110 and the reset transistor 112. A conductive feature 132 overlaps a portion of a gate stack of the source-follower transistor 114 and connects to the floating diffusion region 120. The image sensor device 100 also includes various isolation features formed in the substrate to isolate various regions of the substrate to prevent leakage currents between various regions. In the depicted embodiment, a doped isolation feature 108 is formed in the pixel region 101 to isolate the photodetector 106, the transfer transistor 110, the reset transistor 112, the source-follower transistor 114 and the select transistor 116. Various dielectric isolation features 126 are formed in the periphery region as shown in FIG. 1C.

Figure 1C:
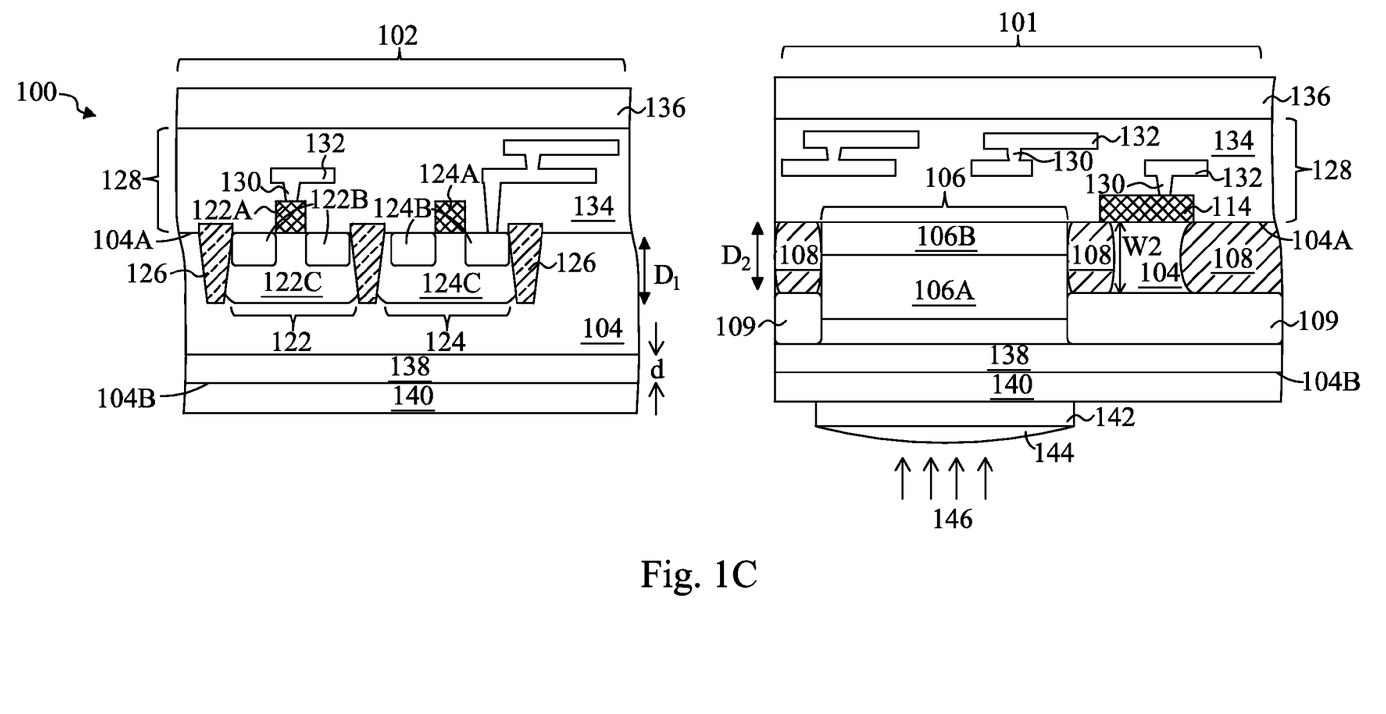
FIG. 1C is a cross sectional view of the pixel region along line B-B' in FIG. 1B and a periphery region of the image sensor device according to one or more embodiments of this disclosure.

FIG. 1C is a cross sectional view of the pixel region 101 along line B-B' in FIG. 1B and a periphery region 102 of the image sensor device 100. The image sensor device 100 includes a substrate 104 having a front surface 104A and a back surface 104B. In the depicted embodiment, the substrate 104 is a semiconductor substrate including silicon. Alternatively or additionally, the substrate 104 includes another elementary semiconductor, such as germanium; a compound semiconductor including silicon carbide, gallium arsenic; an alloy semiconductor including SiGe, GaAsP, AlInAs, and/or AlGaAs; or combinations thereof. The substrate 104 may be a semiconductor on insulator (SOI). The substrate 104 may have various doping configurations depending on design requirements (e.g., p-type substrate or n-type substrate). In some embodiments, the p-type refers to making holes as majority charge carriers in a semiconductor material, and the n-type refers to making electrons as majority charge carriers in a semiconductor material. In the depicted embodiment, the substrate 104 is a p-type substrate. P-type dopants that the substrate 104 is doped with include boron, gallium, indium, other suitable p-type dopants, or combinations thereof. The substrate 104 may alternatively be an n-type doped substrate. N-type dopants that the substrate 104 can be doped with include phosphorus, arsenic, other suitable n-type dopants, or combinations thereof.

The pixel region 101 includes at least one photodetector 106, such as a photodiode, that includes a light-sensing region 106A and a pinned layer 106B. The light-sensing region 106A is a doped region having a first conductivity type of dopants formed in the substrate 104, specifically along the front surface 104A of the substrate 104. In the depicted embodiment, the light-sensing region 106A is an n-type doped region. The pinned layer 106B is a doped layer overlapping the light-sensing region 106A at the front surface 104A of the substrate 104. The pinned layer 106 has a conductivity type of dopants opposite to the light-sensing region 106A. In the depicted embodiment, the pinned layer 106B is a p-type implanted layer.

The pixel region 101 further includes various transistors, such as the transfer transistor 110 (shown in FIG. 1B), the reset transistor 112 (shown in FIG. 1B), the source-follower transistor 114 and the select transistor 116 (shown in FIG. 1B). Each transistor has a corresponding gate stack disposed over the front surface 104A of the substrate 104. In the depicted embodiment, the gate stack of the source-follower transistor 114 overlies an isolation well region 109. A top surface of the isolation well region 109 is away from the front surface 104A with a distance $W_2$. The distance $W_2$ is in a range from about 1000 Å to about 3000 Å. A bottom surface of the isolation well region 109 is substantially aligned with the back surface 104B. The isolation well region 109 has a second conductivity type opposite to the first conductivity type of the light-sensing region 106A. In the depicted embodiment, the isolation well region 109 is a p-type doped region. A dosage used for the isolation well region 109 is from about $1\times10^{11}$ to $3\times10^{11}$ atoms/cm$^3$. The isolation well region 109 surrounds the light-sensing region 106A of photodetector 106. The gate stack of each transistor includes a gate dielectric layer and a gate electrode layer. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN or combinations thereof.

The periphery region 102 may include readout circuitry and/or control circuitry coupled to the pixel region 101 to provide an operation environment for the pixel region 10. In the depicted embodiment, a PMOS transistor 122 and a NMOS transistor 124 are shown. The PMOS transistor 122 includes a gate stack 122A and source/drain regions 122B having p-type conductivity formed in a n-type well 122C. The NMOS transistor 124 includes a gate stack 124A and source/drain regions 124B having n-type conductivity formed in a p-type well 124C.

The image sensor device 100 further includes a plurality of dielectric isolation features 126 formed in substrate 104 of the periphery region 102 and a plurality of doped isolation features 108 formed in substrate 104 of the pixel region 101. The doped isolation features 108 and the dielectric isolation features 126 isolate various regions of the substrate 104 to prevent leakage currents between various regions. In the depicted embodiment, the dielectric isolation features 126 and the doped isolation features 108 isolate the PMOS transistor 122 and the NMOS transistor 124, the photodetector 106, the transfer transistor 110 (shown in FIG. 1B), the reset transistor 112 (shown in FIG. 1B), the source-follower transistor 114 and the select transistor 116 (shown in FIG. 1B).

The dielectric isolation features 126 include silicon oxide, silicon nitride, silicon oxynitride, other insulating material, or combination thereof. Each of the dielectric isolation features 126 has a depth $D_1$ extending form the front surface 104A into the substrate 104. The depth $D_1$ is in a range of about 2000 Å to about 3500 Å.

Each of the doped isolation features 108 has a depth $D_2$ extending form the front surface 104A into the substrate 104. The depth $D_2$ is in a range from about 1000 Å to about 3000 Å. The doped isolation feature 108 has the second conductivity type as the isolation well region 109. The depth $D_2$ of doped isolation features 108 is substantially equal to the distance $W_2$ of the isolation well region 109 to the front surface 104A of the substrate 104. The doped isolation features 108 and the isolation well regions 109 surround the light-sensing region 106A of the photodetector 106 to prevent horizontal leakage paths between the photodetector 106 and other regions. In the depicted embodiment, doped isolation feature 108 is a p-type doped region. P-type dopants of the doped isolation feature 108 include boron (B), $BF_2$, gallium, indium, other suitable p-type dopants or combination thereof. A dosage used for the dopants is about from about $2\times10^{12}$ to about $8\times10^{12}$ atoms/cm$^3$. Alternatively, when the isolation well region 109 is a n-type doped region, doped isolation feature 108 is also a n-type doped region. N-type dopants of the doped isolation feature 108 include phosphorus, arsenic, other suitable n-type dopants or combination thereof.

The image sensor device 100 further includes a multilayer interconnect (MLI) 128 disposed over the front surface 104A of the substrate 104, including over the photodetector 106. The MLI 128 is coupled to various components of the image sensor device 100, for example the photodetector 106, such that the various components of the image sensor device 100 are operable to properly respond to illuminated light (imaging radiation). The MLI 128 includes various conductive features 130 and 132, which may be vertical interconnects 130, such as contacts and/or vias 130, and horizontal interconnects 132, such as lines 132. The various conductive features 130 and 132 include conductive materials, such as aluminum, aluminum/silicon/copper alloy, titanium, titanium nitride, tungsten, polysilicon, metal silicide, or combinations thereof.

The various conductive features 130 and 132 of the MLI 128 are interposed in an interlayer dielectric (ILD) layer 134. The ILD layer 134 may include silicon dioxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, polyimide, or combinations thereof. The ILD layer 134 may have a multilayer structure.

A carrier wafer 136 is disposed over the front surface 104A of the substrate 104. In the depicted embodiment, the carrier wafer 136 is bonded to the MLI 128. The carrier wafer 136 includes silicon or glass. The carrier wafer 136 can provide protection for the various features (such as the photodetector 106) formed on the front surface 104A of the substrate 104, and can also provide mechanical strength and support for processing the back surface 104B of the substrate 104.

The image sensor device 100 further includes a doped layer 138 disposed at the back surface 104B of the substrate 104. The doped layer 138 is formed by an implantation process, diffusion process, annealing process or combinations thereof. In the depicted embodiment, the doped layer 138 includes p-type dopants, such as boron, gallium, indium or combinations thereof. The doped layer 138 has a dopant depth, d, that extends into the substrate 104 from the back surface 104B of the substrate 104. The dopant depth, dopant concentration, dopant profile, or combination thereof of the doped layer 138 may be selected to optimize image quality by increasing quantum efficiency, reducing dark current or reducing white pixel defects.

The image sensor device 100 may further include an antireflective layer 140, a color filter 142 and a lens 144 disposed over the back surface 104B of the substrate 104. The antireflective layer 140 includes a dielectric material, such as silicon nitride or silicon oxynitride.

The color filter 142 is disposed over the antireflective layer 140, and is aligned with the light-sensing region 106A of the photodetector 106. The color filter 142 is designed to filter through light of a predetermined wavelength. For example, the color filter 142 may filter through visible light of a red wavelength, a green wavelength, or a blue wavelength to the photodetector 106. In an example, the color filter 142 includes a dye-based (or pigment-based) polymer for filtering out a specific frequency band (for example, a desired wavelength of light).

The lens 144 is disposed over the color filter 142 and is also aligned with the light-sensing region 106A of the photodetector 106. The lens 144 may be in various positional arrangements with the photodetector 106 and color filter 142, such that the lens 144 focuses an incident radiation 146 on the light-sensing region 106A of the photodetector 106. Alternatively, the position of the color filter layer 142 and the lens 144 may be reversed, such that the lens 144 is disposed between the antireflective layer 140 and color filter 142.

In an operation of the image sensor device 100 according to one or more embodiments, the image sensor device 100 is designed to receive a radiation 146 traveling towards the back surface 104B of the substrate 104. The lens 144 directs the incident radiation 146 to the color filter 142. The incident radiation 146 then passes from the color filter 142 through the antireflective layer 140 to the substrate 104 and corresponding photodetector 106, specifically to light-sensing region 106A. When exposed to the incident radiation 146, the photodetector 106 responds to the incident radiation 146 by accumulating charges. When the gate of transfer transistor 110 is turned on, the charges are transferred from the photodetector 106 to the floating diffusion region 120. Through the connection of the conductive feature 132 (shown in FIG. 1B), the source-follower transistor 114 may convert the charges from the floating diffusion region 120 to voltage signals. The select transistor 116 may allow a single row of the pixel array to be read by read-out electronics. The reset transistor 112 acts as a switch to reset the floating diffusion region 120. When the reset transistor 112 is turned on, the floating diffusion region 120 is effectively connected to a power supply clearing all integrated charges.

Figure 2:
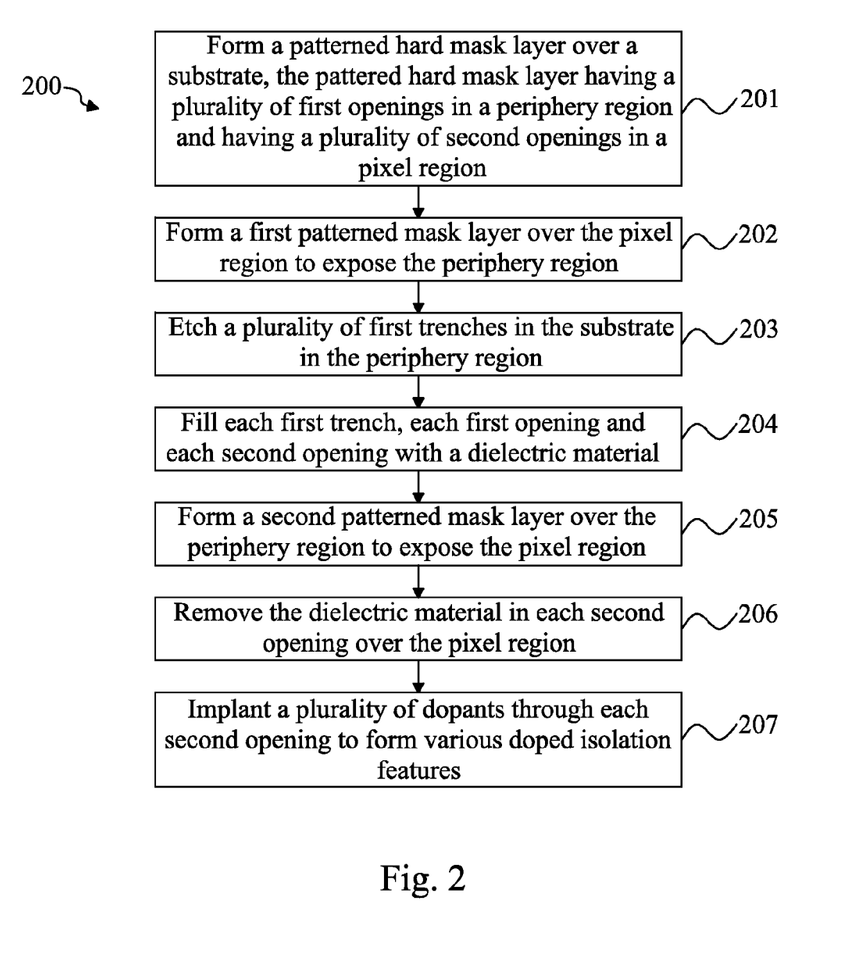
FIG. 2 is a flowchart of a method of forming an image sensor device according to one or more embodiments of this disclosure.

FIG. 2 is a flowchart of a method 200 of forming an image sensor device according to one or more embodiments of this disclosure. The flowchart of the method 200, at operation 201, a patterned hard mask layer is formed over a substrate. In the depicted embodiment, the substrate has a p-type polarity. Alternatively, the substrate has an n-type polarity. The substrate has a pixel region and a periphery region. The patterned hard mask layer has a plurality of first openings in the periphery region and a plurality of second openings in the pixel region. Portions of the substrate are exposed through the plurality of first openings and the plurality of second openings. The method 200 continues with operation 202 in which a first patterned mask layer is formed over the pixel region to expose the periphery region. The first mask layer includes a first type photoresist or a dielectric layer having a different etching resistance to the underlying patterned hard mask layer. In certain embodiments, the first type photoresist is a negative photoresist. Alternatively, the first type photoresist is a positive photoresist. The method 200 continues with operation 203 in which a plurality of first trenches is etched in the substrate. Portions of the substrate exposed through the plurality of first openings in the periphery region are removed. The first patterned mask layer is removed after etching the first trenches. The method 200 continues with operation 204 in which each first trench, each first opening and each second opening is filled with a dielectric material. The method 200 continues with operation 205 in which a second patterned mask layer is formed over the periphery region to expose the pixel region. The second patterned mask layer is over the patterned hard mask layer. The second mask layer includes a second type photoresist or a dielectric layer having a different etching resistance to the underlying patterned hard mask layer. The second type photoresist is opposite to the first type photoresist. In some embodiments, the second type photoresist is a positive photoresist. Alternatively, the second type photoresist is a negative photoresist. The method 200 continues with operation 206 in which the dielectric material in each second opening over the pixel region is removed. The method 200 continues with operation 207 in which a plurality of dopants is implanted through each second opening to form various doped isolation features in the pixel region. In the depicted embodiment, the plurality of dopants has a p-type polarity. Alternatively, the plurality of dopants has an n-type polarity. Further, it is understood that additional steps can be provided before, during, and after the method 200.

FIGS. 3A to 3F are cross-sectional views of the image sensor device 100 at various stages of manufacture according to various embodiments of the method of FIG. 2. Various figures have been simplified for a better understanding of the inventive concepts of the preset disclosure.

Referring back to FIG. 2, the method 200 proceeds from operation 201.

Figure 3A:
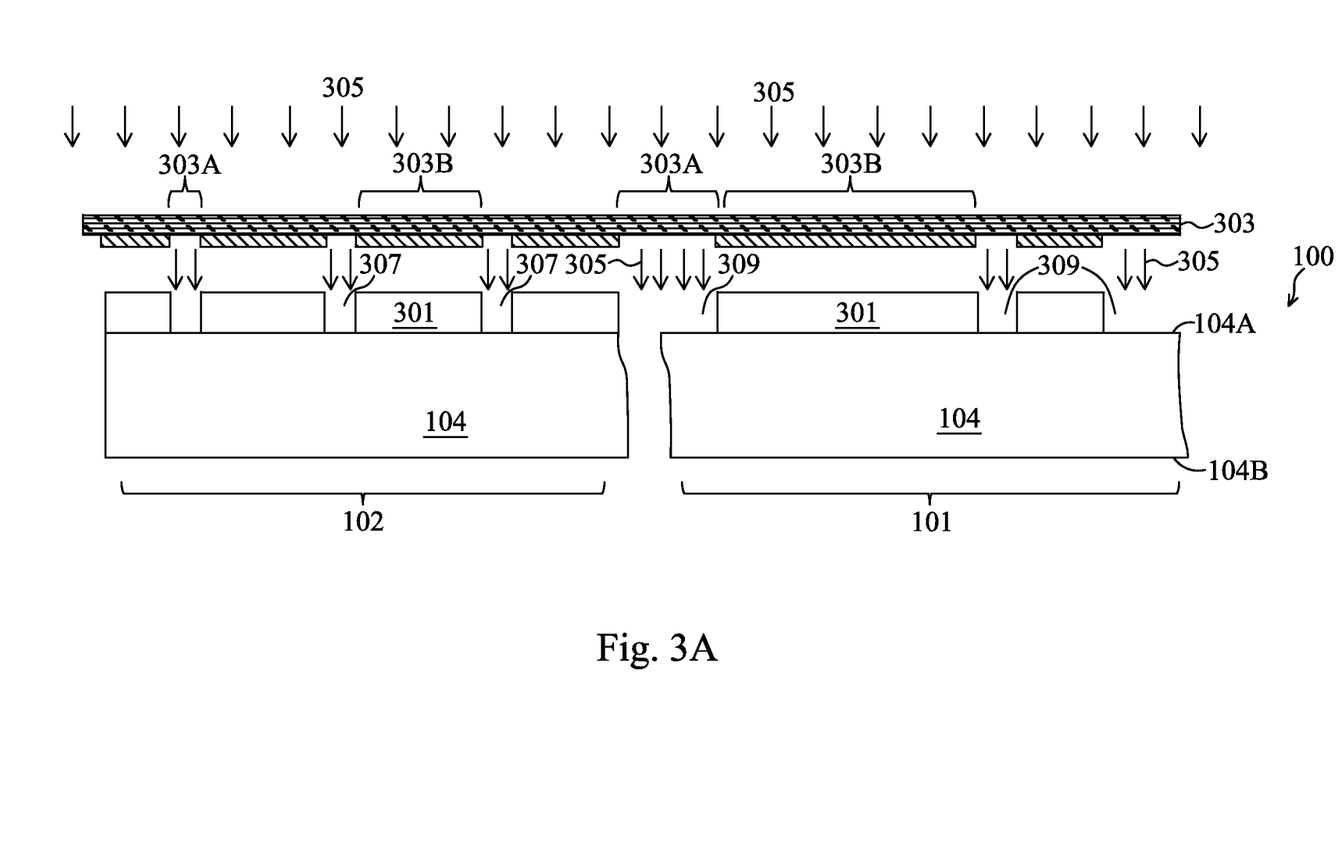
FIGS. 3A to 3F are cross-sectional views of an image sensor device at various stages of manufacture according to various embodiments of the method of FIG. 2.

FIG. 3A a cross-sectional view of the image sensor device 100 after performing operation 201. A substrate 104 has a front surface 104A and a back surface 104B. The substrate 104 is a semiconductor substrate including silicon. In the depicted embodiment, the substrate 104 is a p-type silicon substrate. P-type dopants that the substrate 104 is doped with include boron, gallium, indium, other suitable p-type dopants, or combinations thereof. Alternatively, the substrate 104 includes suitable materials mentioned in the previous paragraphs.

A hard mask layer 301 is formed over the front surface 104A of the substrate 104. The hard mask layer 301 may have multilayer structure. In some embodiments, hard mask layer 301 includes a pad layer (not shown) and a dielectric layer (not shown) over the pad layer. The pad layer, such as oxide layer, acts as a stress buffer layer between the substrate 104 and the overlying dielectric layer The dielectric layer comprises a nitrogen-containing material, such as silicon nitride or silicon oxynitride. Alternatively, the dielectric layer includes an amorphous carbon material, silicon carbide or tetraethylorthosilicate (TEOS). The hard mask layer 301 is formed through a process such as chemical vapor deposition (CVD) or plasma enhanced chemical vapor deposition (PECVD).

Then, a first lithography patterning process is performed on the hard mask layer 301. The first lithography patterning process includes photoresist coating, soft baking, mask aligning, exposure, post-exposure baking, developing the photoresist, rinsing, drying or combinations thereof. In photoresist coating, a photoresist layer (not shown) is coated on the hard mask layer 301. In mask aligning, a photomask 303 having a mask pattern is aligned with the substrate 104. The mask pattern is designed according to integrated circuit features to be formed on a semiconductor substrate. The photomask 303 includes transparent areas 303A and non-transparent areas 303B to construct the mask pattern. In exposure, a radiation beam 305 travels travel through the transparent areas 303A of the photomask 303 to the underlying photoresist layer on the substrate 104. The non-transparent areas 303B block the radiation beam 305 to the underlying photoresist layer. In developing the photoresist, integrated circuit features in the photomask 303 are transferred to the underlying photoresist layer on the substrate 104. In substrate 104, a pixel region 101 and a periphery region 102 are assigned in the substrate 104. Integrated circuit features, having a plurality of first openings 307 and a plurality of second openings 309, in the photoresist layer are formed over the periphery region 102 and the pixel region 101.

Next, the hard mask layer 301 is patterned through etching processes such as reactive ion etching (RIE) by using the overlying photoresist layer as an etching mask. Integrated circuit features in the photoresist layer are transferred into the patterned hard mask layer 301. The patterned hard mask layer 301 has the plurality of first openings 307 over the periphery region 102 and the plurality of second openings 309 over the pixel region 101. Portions of the front surface 104A of the substrate 104 are exposed through the plurality of first openings 307 and the plurality of second openings 309.

Referring back to FIG. 2, the method 200 continues with operations 202 and 203. A first patterned mask layer is formed over the pixel region to expose the periphery region. A plurality of first trenches is etched in the substrate in the periphery region.

Figure 3B:
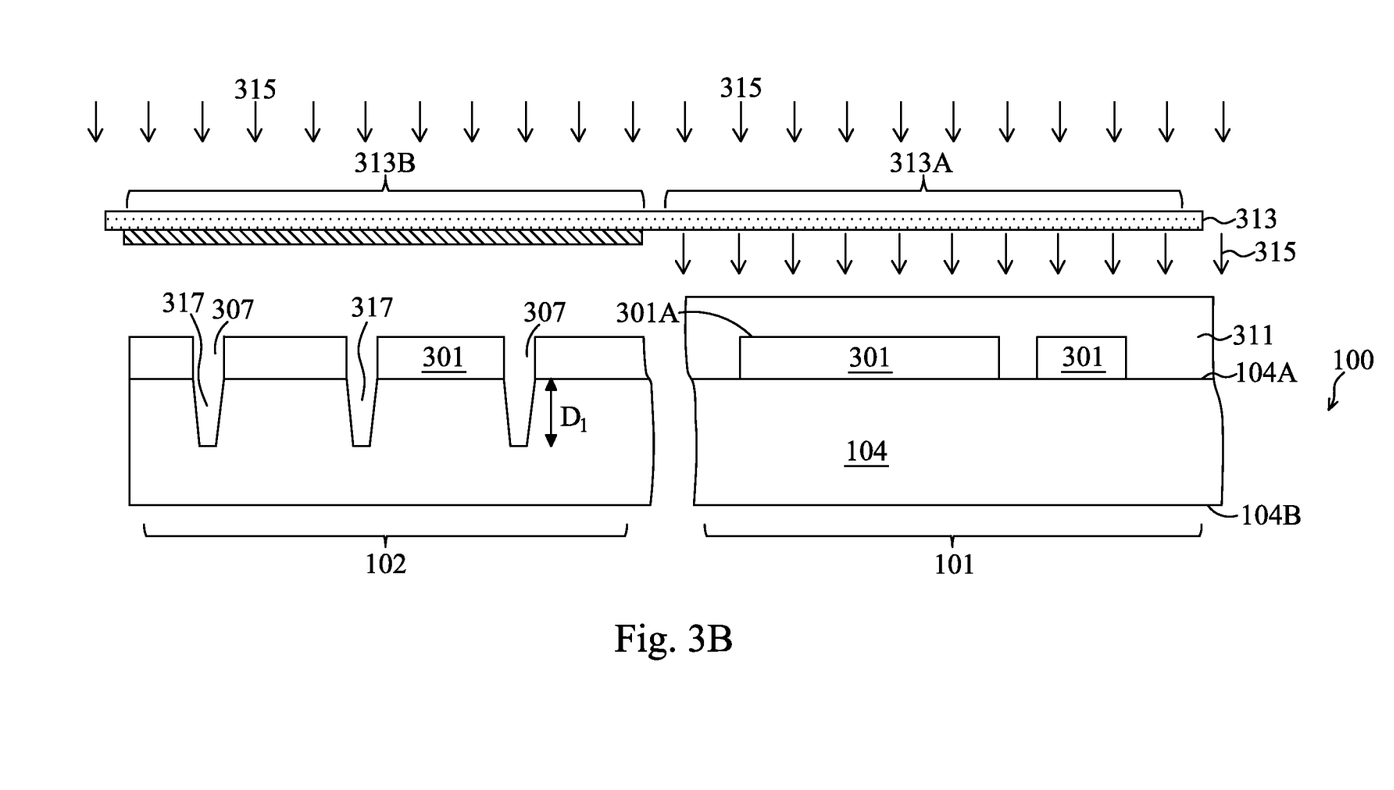

FIG. 3B is a cross-sectional view of the image sensor device 100 after performing operations 202 and 203. In operation 202, a first mask layer 311 is formed over the patterned hard mask layer 301. The first mask layer 311 overfills the first openings 307 and the second openings 309 to a level higher than a top surface 301A of the hard mask layer 301. The first mask layer 311 includes a first type photoresist 311 or a dielectric material which has different etching resistance to the underlying hard mask layer 301. The first mask layer 311 is patterned through suitable photolithographic and/or etching processes to cover the pixel region 101 and expose the periphery region 102.

In certain embodiments, the first type photoresist 311 is a negative photoresist. A second lithography patterning process is performed to coat the first type photoresist 311 on the patterned hard mask layer 301. A photomask 313 has a mask pattern with a transparent area 313A and a non-transparent area 313B used for exposure operation. During an exposure operation, a radiation beam 315 travels travel through the transparent area 313A of the photomask 313 to the underlying first type photoresist 311 on the substrate 104. The non-transparent area 313B blocks the radiation beam 315 to the underlying first type photoresist 311. During a development operation, the first type photoresist 311 under the transparent area 313A exposed in the radiation beam 315 is remained to cover the pixel region 101 of the substrate 104. The first type photoresist 311 under the non-transparent area 313B not exposed in the radiation beam 315 is removed to expose the periphery region 102 of the substrate 104.

Alternatively, the first type photoresist 311 is a positive photoresist. The photomask 313 used for exposure operation has an opposite tone mask pattern as shown in FIG. 3B. The transparent area covers the periphery region 102 and the non-transparent area covers the pixel region 101. Through this second lithography patterning process, the first type photoresist 311 covers the pixel region 101 and exposes the periphery region 102.

In operation 203, a plurality of first trenches 317 is etched into the substrate 104 in the periphery region 102. Portions of the substrate 104 exposed through the plurality of the first openings 307 are removed. Each of the first trenches 317 has a depth $D_1$ extending from the front surface 104A into the substrate 104. The depth $D_1$ is in a range from about 2000 Å to about 3500 Å. The pixel region 101 is covered by the patterned mask layer 311 during etching process to form first trenches 317. The patterned mask layer 311 is removed after operation 203.

Referring back to FIG. 2, the method 200 continues with operation 204. Each first trench, each first opening and each second opening are filled with a dielectric material.

Figure 3C:
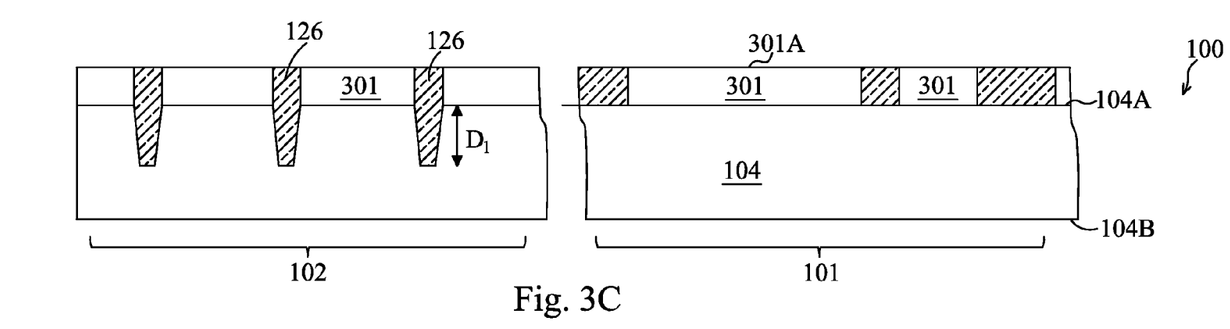

FIG. 3C a cross-sectional view of the image sensor device 100 after performing operation 204. In at least one embodiment, a dielectric material is formed overfilling each first trench 317, each first opening 307, each second opening 309 and the hard mask layer 301. A planarization process, such as a chemical mechanical polishing (CMP) process and/or an etching process, is applied to the dielectric material to reduce a thickness of the dielectric material to expose the top surface 301A of the patterned hard mask layer 301. A plurality of the dielectric isolation features 126 are formed in the corresponding first trenches 317 and first openings 307 in the periphery region 102. Each second opening 309 in the pixel region 101 is also filled with the dielectric material. The dielectric isolation features 126 having the same depth $D_1$ as the first trenches 317 electrically isolate various regions in the substrate 104.

Referring back to FIG. 2, the method 200 continues with operations 205 and 206. A second patterned mask layer is formed over the periphery region to expose the pixel region. The dielectric material in each second opening over the pixel region is removed.

Figure 3D:
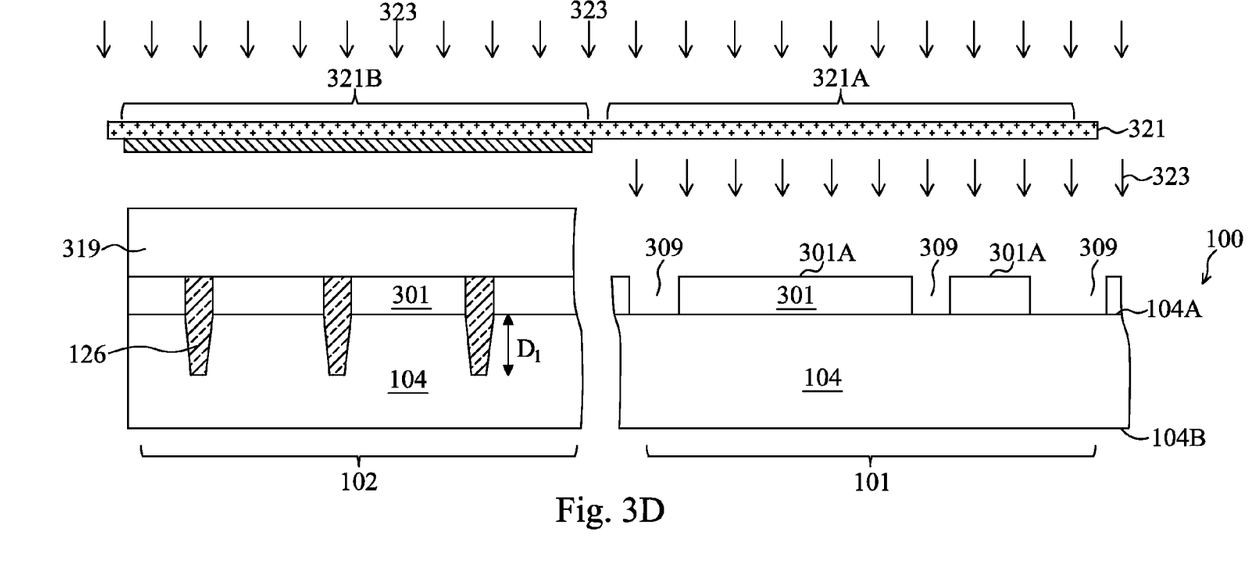

FIG. 3D a cross-sectional view of the image sensor device 100 after performing operations 205 and 206. In operation 205, a second mask layer 319 is formed over the patterned hard mask layer 301, and over the dielectric material in the first openings 307 and the second openings 309. The second mask layer 319 includes a second type photoresist 319 or a dielectric material which has different etching resistance to the underlying hard mask layer 301. The second mask layer 319 is patterned through suitable photolithographic and/or etching processes to cover the periphery region 102 and expose the pixel region 101. In some embodiments, the second type photoresist 319 is opposite to the first type photoresist 311.

In some embodiments, the second type photoresist 319 is a positive photoresist. A third lithography patterning process is performed to coat the second type photoresist 319 on the hard mask layer 301. A photomask 321 has a mask pattern with a transparent area 321A and a non-transparent area 321B used for exposure operation. During an exposure operation, a radiation beam 323 travels travel through the transparent area 321A of the photomask 321 to the underlying second type photoresist 319 on the substrate 104. The non-transparent area 321B blocks the radiation beam 323 to the underlying second type photoresist 319. During a development operation, the second type photoresist 319 under the transparent area 321A exposed in the radiation beam 323 is removed to expose the pixel region 101 of the substrate 104. The second type photoresist 319 under the non-transparent area 321B not exposed in the radiation beam 323 is remained to cover the periphery region 102 of the substrate 104.

Alternatively, the second type photoresist 319 is a negative photoresist. The photomask 321 used for exposure operation has an opposite tone mask pattern as shown in FIG. 3D. The transparent area covers the periphery region 102 and the non-transparent area covers the pixel region 101. Through this third lithography patterning process, the patterned second type photoresist 319 covers the periphery region 102 and exposes the pixel region 101.

Advantageously, the second type photoresist 319 is opposite to the first type photoresist 311. During the second and the third lithography patterning processes, the photomask 313 and the photomask 321 could be the same photomask. By using different type photoresists 311 and 319, the second and the third lithography patterning processes can use the same photomask to cover either the periphery region 102 or the pixel region 101 in operations 202 and 205. This disclosure may reduce the cost in lithography patterning processes by using the same photomask layer for different process operations.

In other embodiments, the second and the third lithography patterning processes may use different photomasks or a same type of photoresist depending on process requirements.

In operation 206, the dielectric material in each second opening 309 over the pixel region 101 is removed. Portions of the substrate 104 are exposed through the plurality of the second openings 309. The periphery region 102 is covered by the second mask layer 319 during the dielectric material removing process. The second mask layer 319 may be removed after operation 206.

Referring back to FIG. 2, the method 200 continues with operation 207. A plurality of dopants is implanted through each second opening to form various doped isolation features in the pixel region.

Figure 3E:
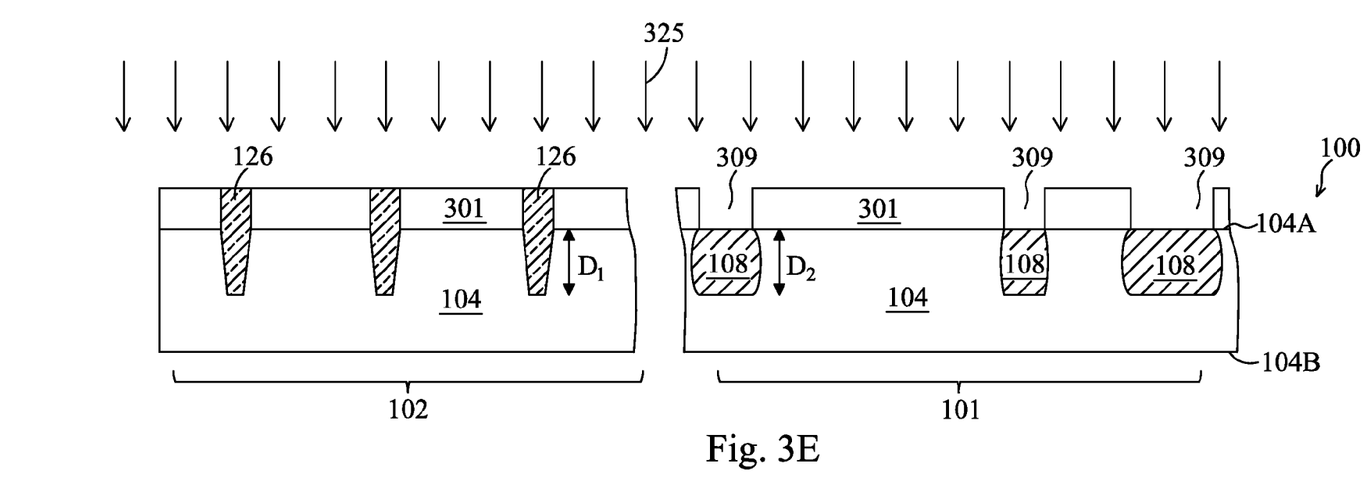

FIG. 3E a cross-sectional view of the image sensor device 100 after performing operation 207. A plurality of dopants 325 is implanted through each second opening 309 into the pixel region 101 of the substrate 104 to form various doped isolation features 108. The plurality of dopants 325 has a second conductivity type. Doped isolation features 108 are formed to surround active areas of the transistors (110, 112, 114 and 116 in FIG. 1B) not covered by the patterned hard mask layer 301. In the depicted embodiment, doped isolation feature 108 is a p-type doped region. P-type dopants of the doped isolation feature 108 include boron (B), $BF_2$, gallium, indium, other suitable p-type dopants or combination thereof. A dosage used for the dopants is from about $2 \times 10^{12}$ to about $8 \times 10^{12}$ atoms/cm$^3$. Each of the doped isolation features 108 has a depth $D_2$ extending form the front surface 104A into the substrate 104. The depth $D_2$ is in a range of about 1000 Å to about 3000 Å. The doped isolation features 108 surround the active areas of the transistors (110, 112, 114 and 116 in FIG. 1B) and also surround the light-sensing region 106A of the photodetector 106 (shown in FIGS. 1B and 1C). The possible horizontal leakage paths between the photodetector 106 and the transistors (110, 112, 114 and 116 in FIG. 1B) may be eliminated. When the depth $D_2$ is less than 1000 Å, the doped isolation feature 108 could not electrically isolate various regions. Hence, the device performance of the image sensor device 100 may reduce. When the depth $D_2$ is larger than 3000 Å, the hard mask layer 301 does not effectively protect the underlying substrate 114 from damage during the high energy implantation process to achieve the depth $D_2$.

Figure 3F:
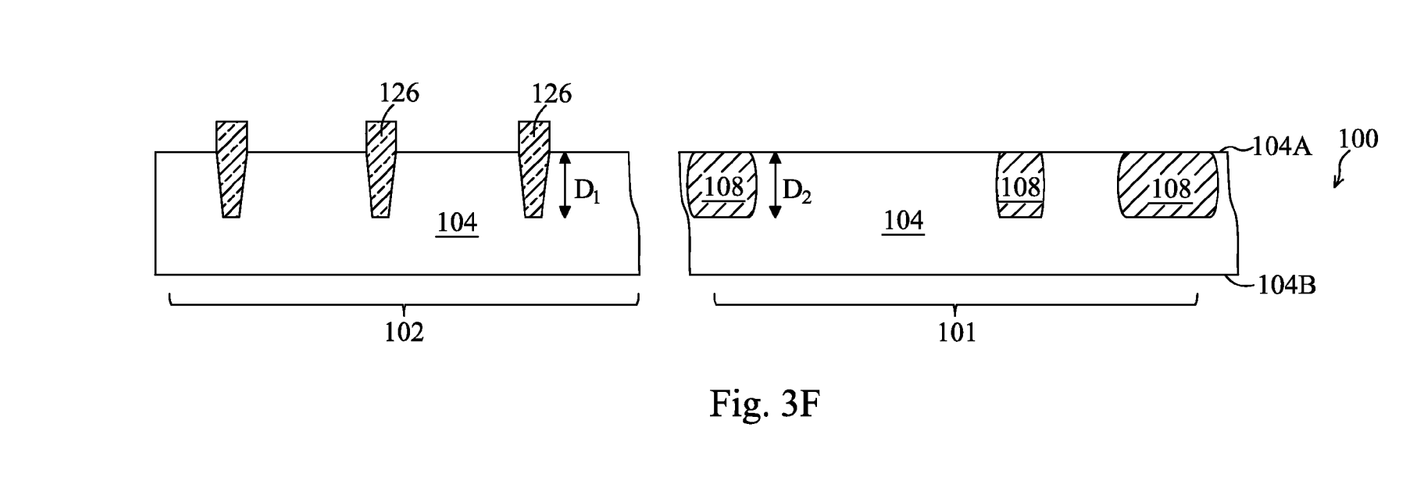

It is understood that additional steps can be provided before, during, and after the operation 207 of the method 200. For example, FIG. 3F is a cross-sectional view of the image sensor device 100 after the operation 207. The hard mask layer 301 is removed after the doped isolation feature 108 formation. The dielectric isolation features 126 may be further planarized to reduce a height of the dielectric isolation features 126 above the frond surface 104 of the substrate 104.

Additional steps may be performed to achieve the image sensor device 100 as shown in FIG. 1C. The image sensor device 100 further includes a photodetector 106, such as a photodiode, that includes a light-sensing region 106A and a pinned layer 106B. The light-sensing region 106A is a doped region having a first conductivity type of dopants formed in the substrate 104, specifically along the front surface 104A of the substrate 104. The first conductivity type of the light-sensing region 106A is opposite to the second conductivity type of the doped isolation feature 108. In the depicted embodiment, the light-sensing region 106A is an n-type doped region. The pinned layer 106B is a doped layer overlapping the light-sensing region 106A at the front surface 104A of the substrate 104. The pinned layer 106 has a conductivity type of dopants opposite to the light-sensing region 106A. In the depicted embodiment, the pinned layer 106B is a p-type implanted layer.

An isolation well region 109 having the second conductivity type may be formed in the pixel region 101. The isolation well region 109 has the second conductivity type as the doped isolation feature 108. The isolation well region 109 is beneath the front surface 104A of the substrate with a distance $W_2$. The distance $W_2$ is in a range from about 1000 Å to about 3000 Å. A bottom surface of the isolation well region 109 is substantially identical to the back surface 104B of the substrate 104. The distance $W_2$ of the isolation well region 109 to the front surface 104A of the substrate 104 is substantially equal to the depth $D_2$ of doped isolation features 108. As shown in FIG. 1C, the doped isolation features 108 and the isolation well regions 109 surround the light-sensing region 106A of the photodetector 106 to prevent horizontal leakage paths between the photodetector 106 and other regions. The isolation well region 109 is formed by lithography patterning and implantation process. In the depicted embodiment, the isolation well region 109 is a p-type doped region. P-type dopants of the isolation well region 109 include as boron, gallium, indium or combinations thereof. A dosage used for the dopants is from about $1 \times 10^{11}$ atoms/cm$^3$ to about $3 \times 10^{11}$ atoms/cm$^3$. Alternatively, the isolation well region 109 is a n-type doped region including n-type dopants such as phosphorus, arsenic, other suitable n-type dopants or combination thereof.

In the periphery region 102, a n-type well 122C and a p-well 124C are formed in the substrate 104 by implantations. Source/drain regions 122B and source/drain regions 124B are formed in the corresponding n-type well 122C and p-well 124 by implantations.

A plurality of gate stacks 114, 122A and 124B are formed on the front surface 104A of the substrate 104. The gate stack 114 corresponds to a source-follower transistor 114 in the pixel region 101. The gate stacks 122A and 124B correspond to the n-type well 122C and the p-well 124C in the periphery region 102. The gate stacks 122A and source/drain regions 122B in the n-type well 122C construct a PMOS transistor. Likewise, the gate stacks 124A and source/drain regions 124B in the p-type well 124C construct a NMOS transistor. The gate stacks 114, 122A and 124B are formed by suitable process, including deposition, lithography patterning, and etching processes.

The image sensor device 100 further includes a multilayer interconnect (MLI) 128 disposed over the front surface 104A of the substrate 104. The MLI 128 is coupled to various components of the image sensor device 100, such as the photodetector 106. The MLI 128 includes various conductive features, which may be vertical interconnects, such as contacts and/or vias 130, and horizontal interconnects, such as lines 132. The conductive features 130 and 132 are formed by suitable process, including deposition, lithography patterning, and etching processes to form vertical and horizontal interconnects.

The various conductive features 130 and 132 of the MLI 128 are disposed in an interlayer dielectric (ILD) layer 134. The ILD layer 134 may have a multilayer structure. The ILD layer 134 may be formed by suitable process, including chemical vapor deposition (CVD) or plasma enhanced chemical vapor deposition (PECVD). In one example, the MLI 128 and the ILD layer 134 may be formed in an integrated process including a damascene process.

In some embodiments, further process steps are included after the MLI 128 formation. As illustrated in FIG. 1C, a carrier wafer 136 is bonded to the MLI 128. The carrier wafer 136 provides mechanical strength and support for processing the back surface 104B of the substrate 104. A planarization process, such as a chemical mechanical polishing (CMP) process, is applied to the back surface 104B of the substrate 104 to reduce a thickness of the substrate 104. A doped layer 138 is formed by an implantation process, diffusion process, annealing process or combinations thereof through the back surface 104B. The doped layer 138 may recover the back surface 104B damage during the planarization process, and reduce dark current and white pixels. An antireflective layer 140, a color filter 142 and a lens 144 disposed over the back surface 104B of the substrate 104. The color filter 142 and the lens 144 are aligned with the light-sensing region 106A of the photodetector 106.

Various embodiments of the present disclosure may be used to improve the performance of an image sensor device. For example, the doped isolation feature 108 is formed in the pixel region 101 by implantation processes. This disclosure eliminates the drawbacks in conventional methods with etching damages during the shallow trench isolation (STI) formation in the pixel region. Without etching damages, this disclosure could reduce dark current or reduce white pixel defects of the image sensor device. In another example, the first openings 307 and the second openings 309 are defined in integrated circuit features of the same photomask 303. The first openings 307 and the second openings 309 are formed over the substrate 104 through the same first lithography patterning process. The dielectric isolation features 126 and doped isolation features 108 are later formed in the corresponding first openings 307 and second openings 309 in the periphery region 102 and the pixel region 101. Through the same first lithography patterning process to define the locations of the first openings 307 and the second openings 309, this disclosure eliminates the overlay issue that may happen between dielectric isolation features 126 and doped isolation features 108. As device scaling down continues, the locations of dielectric isolation features 126 and doped isolation features 108 are accurately controlled to isolate various regions of the substrate to prevent leakage currents between various regions.

One aspect of the disclosure describes a method of forming an image sensor device. A patterned hard mask layer is formed over a substrate. The patterned hard mask layer has a plurality of first openings in a periphery region of the substrate, and a plurality of second openings in a pixel region of the substrate. A first patterned mask layer is formed over the pixel region to expose the periphery region. A plurality of first trenches is etched into the substrate in the periphery region. Each first trench, each first opening and each second opening are filled with a dielectric material. A second patterned mask layer is formed over the periphery region to expose the pixel region. The dielectric material in each second opening over the pixel region is removed. A plurality of dopants is implanted through each second opening to form various doped isolation features in the pixel region.

A further aspect of the disclosure describes a method of forming an image sensor device. A substrate includes a front surface and a back surface, and a pixel region and a periphery region. A patterned hard mask layer is formed over the front surface of the substrate. The patterned hard mask layer has a plurality of first openings in the periphery region, and a plurality of second openings in the pixel region. A first patterned mask layer is formed over the patterned hard mask layer in the pixel region to expose the periphery region. A plurality of first trenches is etched from the front surface in the periphery region. Each first trench, each first opening and each second opening are filled with a dielectric material. A second patterned mask layer is formed over the patterned hard mask layer in the periphery region to expose the pixel region. The dielectric material in each second opening over the pixel region is removed. A plurality of dopants is implanted through each second opening to form various doped isolation features in the pixel region. At least one photodetector is formed in the substrate of the pixel region. The at least one photodetector is surrounded by the doped isolation features. A color filter and a lens are formed over the back surface of the substrate. The color filter and the lens are aligned with the at least one photodetector.

Another aspect of the disclosure describes a method of forming an image sensor device. A substrate includes a front surface and a back surface, and a pixel region and a periphery region. A patterned hard mask layer is formed over the front surface of the substrate. The patterned hard mask layer has a plurality of first openings in the periphery region, and a plurality of second openings in the pixel region. A first patterned photoresist is formed over the patterned hard mask layer in the pixel region to expose the periphery region. A plurality of first trenches is etched from the front surface in the periphery region. Each first trench, each first opening and each second opening are filled with a dielectric material. A second patterned photoresist is formed over the patterned hard mask layer in the periphery region to expose the pixel region. The dielectric material in each second opening over the pixel region is removed. A plurality of dopants is implanted through each second opening to form various doped isolation features in the pixel region. At least one photodetector is formed in the substrate of the pixel region. The at least one photodetector is surrounded by the doped isolation features. A doped layer is formed in the back surface of the substrate.

Embodiments described herein may provide for a method of forming an image sensor device. The method includes forming a patterned hard mask layer over a substrate, wherein the patterned hard mask layer has a plurality of first openings in a periphery region of the substrate, and a plurality of second openings in a pixel region of the substrate. The substrate is etched through the plurality of first openings to form a plurality of first trenches in the substrate. Each trench, each first opening and each second opening is filled with a material, and the material is removed in each second opening over the pixel region. The method further includes implanting dopant through each second opening to form doped isolation features in the pixel region.

In another aspect, embodiments described herein may provide for method of forming an image sensor device that includes providing a substrate having a front surface and a back surface, and a pixel region and a periphery region, and forming a patterned hard mask layer over the front surface of the substrate, wherein the patterned hard mask layer has a first opening in the periphery region, and a second opening in the pixel region. A trench is etched in the front surface of the substrate in the periphery region through the first opening. The method includes filling the trench, the first opening and the second opening with a material, removing the material in the second opening over the pixel region, while leaving the material intact in the trench. The method also includes implanting a dopant through the second opening to form a doped isolation feature in the pixel region.

In yet another aspect, embodiments described herein may provide for a method of forming an image sensor device on a providing a substrate having a front surface and a back surface, and a pixel region and a periphery region. The method includes forming a patterned hard mask layer over the front surface of the substrate, wherein the patterned hard mask layer has a first opening in the periphery region, and a second opening in the pixel region. The method further includes forming a first patterned photoresist covering the patterned hard mask layer in the pixel region and exposing the patterned hard mask in the periphery region. A trench is etched through the first opening. The trench, the first opening and the second opening are filled with a dielectric material. A second patterned photoresist is formed over the patterned hard mask layer covering the periphery region and exposing the pixel region. The method further includes removing the dielectric material in the second opening, and implanting a dopant through the second opening into the substrate to form a doped isolation feature in the pixel region Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming an image sensor device, the method comprising:
    forming a patterned hard mask layer over a substrate, wherein the patterned hard mask layer has a plurality of first openings in a periphery region of the substrate, and a plurality of second openings in a pixel region of the substrate;
    etching the substrate through the plurality of first openings to form a plurality of first trenches in the substrate;
    filling each first trench, each first opening and each second opening with a material;
    removing the material in each second opening over the pixel region; and
    implanting dopant through each second opening to form doped isolation features in the pixel region.

2. The method of claim 1, wherein the material is a dielectric material.

3. The method of claim 1, wherein forming a patterned hard mask comprises etching a hard mask through a patterned photoresist layer.

4. The method of claim 1, further comprising:
    forming at least one photodetector in the pixel region, wherein the at least one photodetector is surrounded by the doped isolation features; and
    forming a doped layer in a back surface of the substrate.

5. The method of claim 4, further comprising: forming a color filter and a lens over the back surface of the substrate, wherein the color filter and the lens are aligned with the at least one photodetector.

6. The method of claim 1, further comprising forming a light-sensing region in the pixel region surrounded by the doped isolation features.

7. The method of claim 6, wherein the light-sensing region has a first conductivity type and the doped isolation features have a second conductivity type opposite to the first conductivity type.

8. The method of claim 1, further comprising:
defining the patterned hard mask layer by a first photomask.

9. A method of forming an image sensor device, the method comprising:
providing a substrate having a front surface and a back surface, and a pixel region and a periphery region;
forming a patterned hard mask layer over the front surface of the substrate, wherein the patterned hard mask layer has a first opening in the periphery region, and a second opening in the pixel region;
etching a trench in the front surface of the substrate in the periphery region through the first opening;
filling the trench, the first opening and the second opening with a material;
removing the material in the second opening over the pixel region, while leaving the material intact in the trench; and
implanting a dopant through the second opening to form a doped isolation feature in the pixel region.

10. The method of claim 9, further comprising: forming at least one photodetector in the substrate of the pixel region, wherein the at least one photodetector is surrounded by the doped isolation features; and
forming a color filter and a lens over the back surface of the substrate, wherein the color filter and the lens are aligned with the at least one photodetector.

11. The method of claim 9, further comprising:
forming a first patterned mask layer over the patterned hard mask layer in the pixel region to expose the periphery region; and
forming a second patterned mask layer over the patterned hard mask layer in the periphery region to expose the pixel region.

12. The method of claim 11, wherein the first mask layer is one of a positive photoresist or a negative photoresist, and the second mask layer is the opposite one of a positive photoresist or a negative photoresist.

13. The method of claim 9, further comprising forming at least one light-sensing region in the pixel region surrounded by the doped isolation features.

14. The method of claim 13, wherein at least one light-sensing region has a first conductivity type and the doped isolation features have a second conductivity type opposite to the first conductivity type.

15. The method of claim 9, further comprising:
defining the patterned mask layer by a first photomask.

16. The method of claim 9, wherein the trench extends into the substrate with a depth of from about 2000 Å to about 3500 Å.

17. The method of claim 9, wherein the doped isolation feature extends into the substrate with a depth of from about 1000 Å to about 3000 Å.

18. A method of forming an image sensor device, the method comprising:
providing a substrate having a front surface and a back surface, and a pixel region and a periphery region;
forming a patterned hard mask layer over the front surface of the substrate, wherein the patterned hard mask layer has a first opening in the periphery region, and a second opening in the pixel region;
forming a first patterned photoresist covering the patterned hard mask layer in the pixel region and exposing the patterned hard mask in the periphery region;
etching a trench through the first opening;
filling the trench, the first opening and the second opening with a material;
forming a second patterned photoresist over the patterned hard mask layer covering the periphery region and exposing the pixel region;
removing the material in the second opening; and
implanting a dopant through the second opening into the substrate to form a doped isolation feature in the pixel region.

19. The method of claim 18, further comprising:
forming at least one photodetector in the substrate of the pixel region, wherein the at least one photodetector is surrounded by the doped isolation features; and
forming a doped layer in the back surface of the substrate.

20. The method of claim 18, wherein the dopant comprises boron (B), BF2, gallium, indium or combination thereof.

* * * * *

UNITED STATES PATENT AND TRADEMARK OFFICE
CERTIFICATE OF CORRECTION

| | |
|---|---|
| PATENT NO. | : 9,437,650 B2 |
| APPLICATION NO. | : 14/721782 |
| DATED | : September 6, 2016 |
| INVENTOR(S) | : Wen-Chen Lu |

It is certified that error appears in the above-identified patent and that said Letters Patent is hereby corrected as shown below:

On the Title page, Item (73) Assignee, Line 1, delete "Taiwam" and insert --Taiwan--.

Signed and Sealed this
Twenty-ninth Day of November, 2016

Michelle K. Lee
*Director of the United States Patent and Trademark Office*